US011665828B2

(12) United States Patent
Lee et al.

(10) Patent No.: US 11,665,828 B2
(45) Date of Patent: May 30, 2023

(54) METHOD FOR MANUFACTURING FCCL CAPABLE OF CONTROLLING FLEXIBILITY AND STIFFNESS OF CONDUCTIVE PATTERN

(71) Applicant: SAMWON ACT CO., LTD., Busan (KR)

(72) Inventors: Kyung Yul Lee, Bucheon-si (KR); Kwang Jong Choi, Ansan-si (KR); Pyoung Woo Lee, Ansan-si (KR); Doo Yul Baek, Ansan-si (KR)

(73) Assignee: SAMWON ACT CO., LTD., Busan (KR)

( * ) Notice: Subject to any disclaimer, the term of this patent is extended or adjusted under 35 U.S.C. 154(b) by 0 days.

(21) Appl. No.: 17/295,015

(22) PCT Filed: Nov. 27, 2019

(86) PCT No.: PCT/KR2019/016455
§ 371 (c)(1),
(2) Date: May 18, 2021

(87) PCT Pub. No.: WO2020/111767
PCT Pub. Date: Jun. 4, 2020

(65) Prior Publication Data
US 2022/0007514 A1 Jan. 6, 2022

(30) Foreign Application Priority Data
Nov. 29, 2018 (KR) .......................... 10-2018-0151028

(51) Int. Cl.
*H05K 3/02* (2006.01)
*H05K 1/03* (2006.01)
(52) U.S. Cl.
CPC ........... *H05K 3/025* (2013.01); *H05K 1/0353* (2013.01); *H05K 2201/0154* (2013.01)

(58) Field of Classification Search
CPC ................ H05K 1/0353; H05K 3/025; H05K 2201/0154
See application file for complete search history.

(56) References Cited

U.S. PATENT DOCUMENTS 3,959,547 A * 5/1976 Polichette ........... C23C 18/1644
428/209
4,048,005 A * 9/1977 Nakagome .............. B32B 15/08
548/312.7
(Continued)

FOREIGN PATENT DOCUMENTS

JP 63296963 A * 12/1988
JP 63299296 A * 12/1988
(Continued)

OTHER PUBLICATIONS

International Search Report for PCT/KR2019/016455 dated Mar. 9, 2020.

*Primary Examiner* — Carl J Arbes
(74) *Attorney, Agent, or Firm* — Quantum Patent Law Firm; Seongyoune Kang

(57) ABSTRACT

Disclosed is a method for manufacturing an FCCL capable of controlling flexibility and stiffness of a conductive pattern. The method for manufacturing an FCCL (Flexible Copper Clad Laminate) includes: an electroforming step of forming a conductive pattern on a mold for electroforming through electroforming; and a transfer step of transferring the conductive pattern from the mold for electroforming to the bottom of a polymer plastic film, wherein the electroforming process is performed in a plating bath equipped with a first metal, a second metal and a third metal, wherein the first metal is copper (Cu), the second metal serves to add flexibility and is one of tin (Sn), gold (Au), silver (Ag) and aluminum (Al), and the third metal serves to add stiffness (Continued)

and is one of nickel (Ni), cobalt (Co), chrome (Cr), iron (Fe), tungsten (W) and titanium (Ti).

16 Claims, 6 Drawing Sheets

(56) References Cited

U.S. PATENT DOCUMENTS

| | | | | |
|---|---|---|---|---|
| 5,047,114 A * | 9/1991 | Frisch | ............ | H05K 3/022 |
| | | | | 156/308.2 |
| 5,049,221 A * | 9/1991 | Wada | ............ | H05K 3/025 |
| | | | | 156/239 |
| 5,989,004 A * | 11/1999 | Cook | ............ | D01D 4/022 |
| | | | | 425/382.2 |
| 6,773,573 B2 * | 8/2004 | Gabe | ............ | C25D 3/38 |
| | | | | 205/267 |
| 2014/0110153 A1 * | 4/2014 | Kashiwagi | ...... | H05K 3/4069 |
| | | | | 174/251 |
| 2015/0382445 A1 * | 12/2015 | Choi | ............ | C23C 18/31 |
| | | | | 174/251 |
| 2018/0027651 A1 * | 1/2018 | Lim | ............ | H01L 21/481 |
| | | | | 361/749 |

FOREIGN PATENT DOCUMENTS

| | | | |
|---|---|---|---|
| JP | 2006-216888 A | * | 8/2006 |
| KR | 10-2006-0077798 A | | 12/2004 |
| KR | 10-2007-0106669 A | | 11/2007 |
| KR | 10-2015-0026728 A | | 3/2015 |
| KR | 10-2018-0018034 A | | 2/2018 |

* cited by examiner

METHOD FOR MANUFACTURING FCCL CAPABLE OF CONTROLLING FLEXIBILITY AND STIFFNESS OF CONDUCTIVE PATTERN

CROSS-REFERENCE TO RELATED APPLICATIONS

This patent application is the U.S. National Stage Application of International Application No. PCT/KR2019/016455, filed Nov. 27, 2019 and the entire contents of which are incorporated herein by reference, which claims priority to Korean Application No. 10-2018-0151028, filed Nov. 29, 2018 and the entire contents of which are incorporated herein by reference.

TECHNICAL FIELD

The present disclosure relates to a method for manufacturing an FCCL (Flexible Copper Clad Laminate), and more particularly, to a method for manufacturing an FCCL capable of controlling the flexibility and stiffness of a conductive pattern.

BACKGROUND ART

According to an announcement of KPCA (Korea Printed Circuit Association), the worldwide PCB (Printed Circuit Board) market in 2015 has a size of about 58 million dollars, and is growing by 3.1% per year. Korea, China, Japan and Taiwan occupy 84% of the worldwide PCB market. As of 2015, the market share of the PCBs manufactured by Korea is the third place (4%) among the entire countries, and the third place (12%) in the region to which Korea belongs.

The largest portion of PCBs manufactured around the world is used for 'communication (about 31%)'. Most of the manufactured PCBs are used as PCBs employed in mobile phones. The second largest portion of the manufactured PCBs is used for computers such as PCs and servers/storages (about 25%).

Recently, the largest change in the PCB market occurs in the FPCB (Flexible PCB) market. FPCB refers to a wiring board using a flexible insulating board.

FCCL (Flexible Copper Clad Laminate) is the core material of the FPCB.

The FCCL may be configured as a laminate of copper clad used as an electric conductor and polyimide used as an insulator, and divided into a single-side FCCL having copper clad formed only on one side thereof and a double-side FCCL having copper clad formed on either side thereof.

FIG. 1 illustrates the structure of a single-side FCCL.

Referring to FIG. 1, the FCCL typically has a structure in which an insulating film is coated with copper clad. An FPCB manufacturer manufactures an FPCB suitable for use by performing an etching process, a through-hole forming process, a laminating process and the like, using a commercial FCCL as a raw material.

As a conductor of the FCCL, Cu is used in most cases. Since Cu serves as a factor to determine the flexibility of a product, it is particularly important to select Cu. The smaller the thickness of a copper clad, the better the flexibility thereof. Depending on the types of copper clads, large differences occur. However, the conventional FCCL has the following problems.

First, when the conventional FCCL is used to manufacture an FPCB, the FCCL may not accurately suit mechanical characteristics required for the FPCB. The reason is that the conventional FCCL is provided as only some types of FCCLs.

The FCCL has several specific standard requirements. In particular, the thickness of a copper clad pattern becomes a problem. In order to control a mechanical characteristic of an FPCB, i.e. flexibility or stiffness, an FCCL that satisfies a desired combination of mechanical characteristics needs to be selected among some FCCLs, in consideration of the thickness of a copper clad pattern, the thickness of an adhesive, the thickness of a polymer plastic film and the like.

Among the mechanical characteristics, the thickness of the copper clad pattern is the most important. Since FCCLs provided as standardized products have only several types of thicknesses, it is very difficult to select suitable one among several types of FCCLs.

Furthermore, an FPCB manufacturing process needs to go though a process of first deciding the thickness of a copper clad pattern in a wide range and then precisely controlling the thickness of the copper clad pattern little by little in a predetermined range, while an FPCB is manufactured and fed back. However, when FCCLs provided as standardized products are used, it is impossible to precisely control the thickness of the copper clad pattern. Furthermore, there is no method capable of controlling the physical characteristics (for example, flexibility and stiffness) of a copper clad pattern forming an FCCL provided as a standardized product. Thus, it is impossible to precisely control the physical characteristics.

Furthermore, since the FCCL is used, the purchase price of the FCCL limits the manufacturing cost of the FPCB. Since the FCCL is relatively expensive, the manufacturing cost of the FPCB inevitably rises.

DISCLOSURE

Technical Problem

Various embodiments are directed to a method for manufacturing a conductive pattern, which is capable of controlling the flexibility and stiffness of a conductive pattern during a process of manufacturing the conductive pattern.

Technical Solution

In a first embodiment, a method for manufacturing an FCCL (Flexible Copper Clad Laminate) includes: an electroforming step of forming a conductive pattern on a mold for electroforming through electroforming; and a transfer step of transferring the conductive pattern from the mold for electroforming to the bottom of a polymer plastic film.

The electroforming process is performed in a plating bath equipped with a first metal, a second metal and a third metal.

The first metal is copper (Cu), the second metal serves to add flexibility and is one of tin (Sn), gold (Au), silver (Ag) and aluminum (Al), and the third metal serves to add stiffness and is one of nickel (Ni), cobalt (Co), chrome (Cr), iron (Fe), tungsten (W) and titanium (Ti).

The second metal is Sn.

The third metal is Ni.

The polymer plastic film is made of PI (Polyimide).

In a second embodiment, a method for manufacturing an FCCL includes: an electroforming step of forming a conductive pattern, having a metal layer made of a first metal, on a mold for electroforming through electroforming; a transfer process of transferring the conductive pattern, having the metal layer made of the first metal, from the mold for electroforming to the bottom of a polymer plastic film; and a first electroplating step of forming a conductive pattern with a two-layer alloy structure constituted by the metal layer made of the first metal and a metal layer made of a second metal, by plating the bottom of the metal layer made of the first metal with a second metal.

The first metal is Cu, and the second metal serves to add flexibility and is one of Sn, Au, Ag and Al.

The second metal is Sn.

The method further includes a second electroplating step of forming a conductive pattern with a three-layer alloy structure, constituted by the metal layer made of the first metal, the metal layer made of the second metal, and a metal layer made of a third metal, by additionally plating the bottom of the metal layer made of the second metal with the metal layer made of the third metal.

The third metal serves to add stiffness, and is one of Ni, Co, Cr, Fe, W and Ti.

The second metal is Sn, and the third metal is Ni.

The polymer plastic film is made of PI.

In a third embodiment, a method for manufacturing an FCCL includes: an electroforming step of forming a conductive pattern, having a metal layer made of a first metal, on a mold for electroforming through electroforming; a transfer process of transferring the conductive pattern, having the metal layer made of the first metal, from the mold for electroforming to the bottom of a polymer plastic film; and an electroplating step of forming a conductive pattern with a two-layer alloy structure, constituted by the metal layer made of the first metal and a binary alloy layer of a second metal and a third metal, by plating the bottom of the metal layer made of the first metal with a binary alloy made of the second metal and the third metal.

The first metal is Cu, the second metal serves to add flexibility and is one of Sn, Au, Ag and Al, and the third metal serves to add stiffness and is one of Ni, Co, Cr, Fe, W and Ti.

The second metal is Sn.

The third metal is Ni.

The polymer plastic film is made of PI (Polyimide).

In a fourth embodiment, a method for manufacturing an FCCL includes: an electroforming process of forming a conductive pattern with a binary alloy layer on a mold for electroforming by plating the mold with a binary alloy of a first metal and a second metal through electroforming; a transfer process of transferring the conductive pattern having the binary alloy layer from the mold for electroforming to the bottom of a polymer plastic film; and an electroplating process of forming a conductive pattern with a two-layer structure, constituted by the binary alloy layer and a metal layer made of a third metal, by plating the bottom of the binary alloy layer with the metal layer made of the third metal.

The first metal is Cu, the second metal serves to add flexibility and is one of Sn, Au, Ag and Al, and the third metal serves to add stiffness and is one of Ni, Co, Cr, Fe, W and Ti.

The second metal is Sn.

The third metal is Ni.

The polymer plastic film is made of PI.

Advantageous Effects

Through the method for manufacturing an FCCL in accordance with the embodiment of the present disclosure, it is possible to manufacture a conductive pattern constituted by a first metal serving as a base for manufacturing the conductive pattern, a second metal for adding flexibility, and a third metal for adding stiffness. The composition ratio and thicknesses of the first to third metals may be controlled to provide an FCCL whose flexibility and stiffness are adjusted.

MODE FOR INVENTION

The best mode for carrying out the present disclosure is as follows.

Among first to fourth embodiments, a preferred embodiment may be selected according to a consumer's purpose of use.

Therefore, any one of the first to fourth embodiments may become the best mode.

In the present disclosure, however, the fourth embodiment will be described below.

Figure 5:
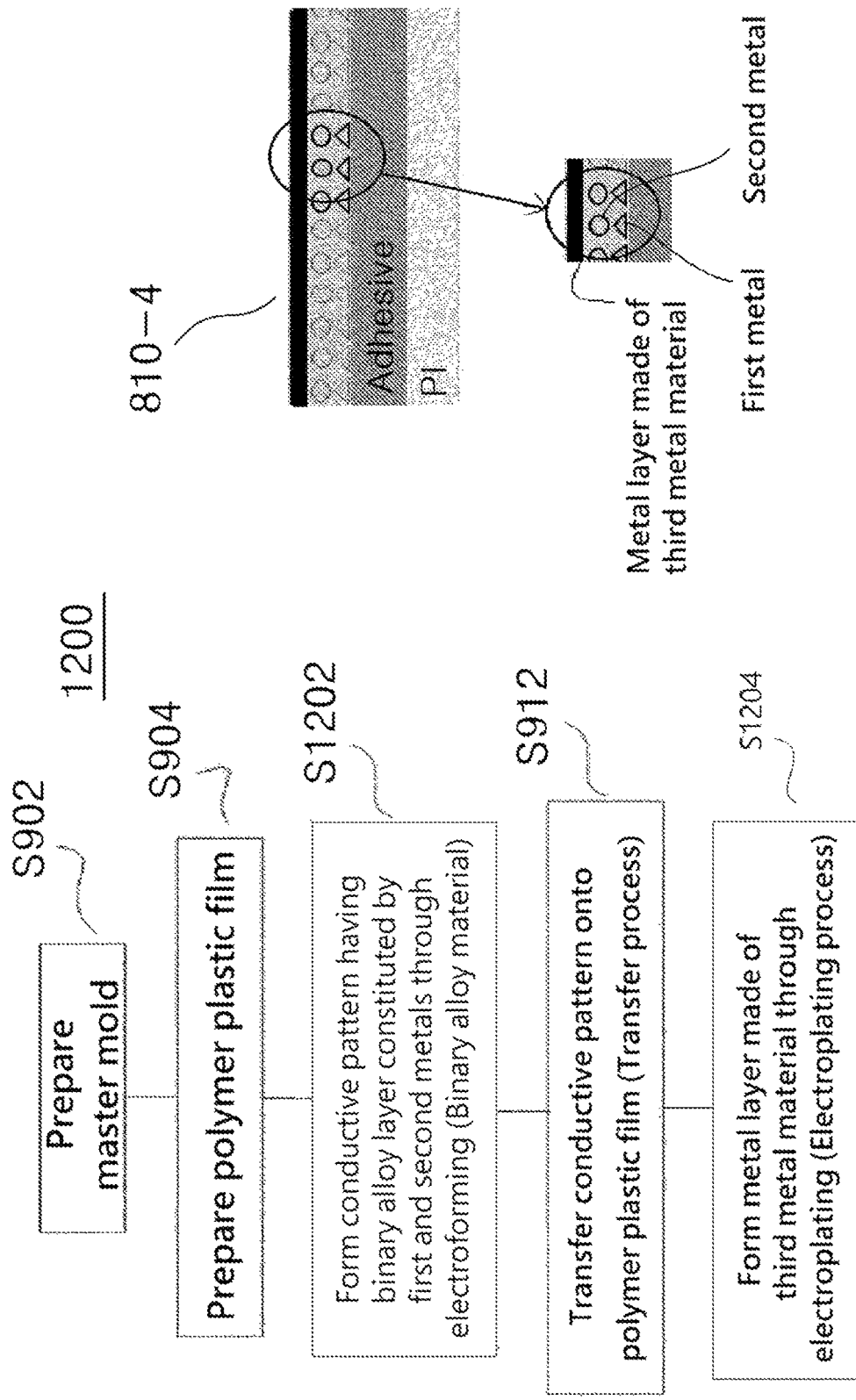
FIG. 5 is a flowchart illustrating a fourth embodiment of the method for manufacturing an FCCL in accordance with the present disclosure.

FIG. 5 is a flowchart illustrating a fourth embodiment of a method for manufacturing an FCCL in accordance with the present disclosure.

Referring to FIG. 5, the fourth embodiment of the method for manufacturing an FCCL in accordance with the present disclosure includes forming a conductive pattern with a multilayered (two-layer) alloy structure constituted by a binary alloy layer and a metal layer through sequential plating processes (see 810-4).

Figure 1:
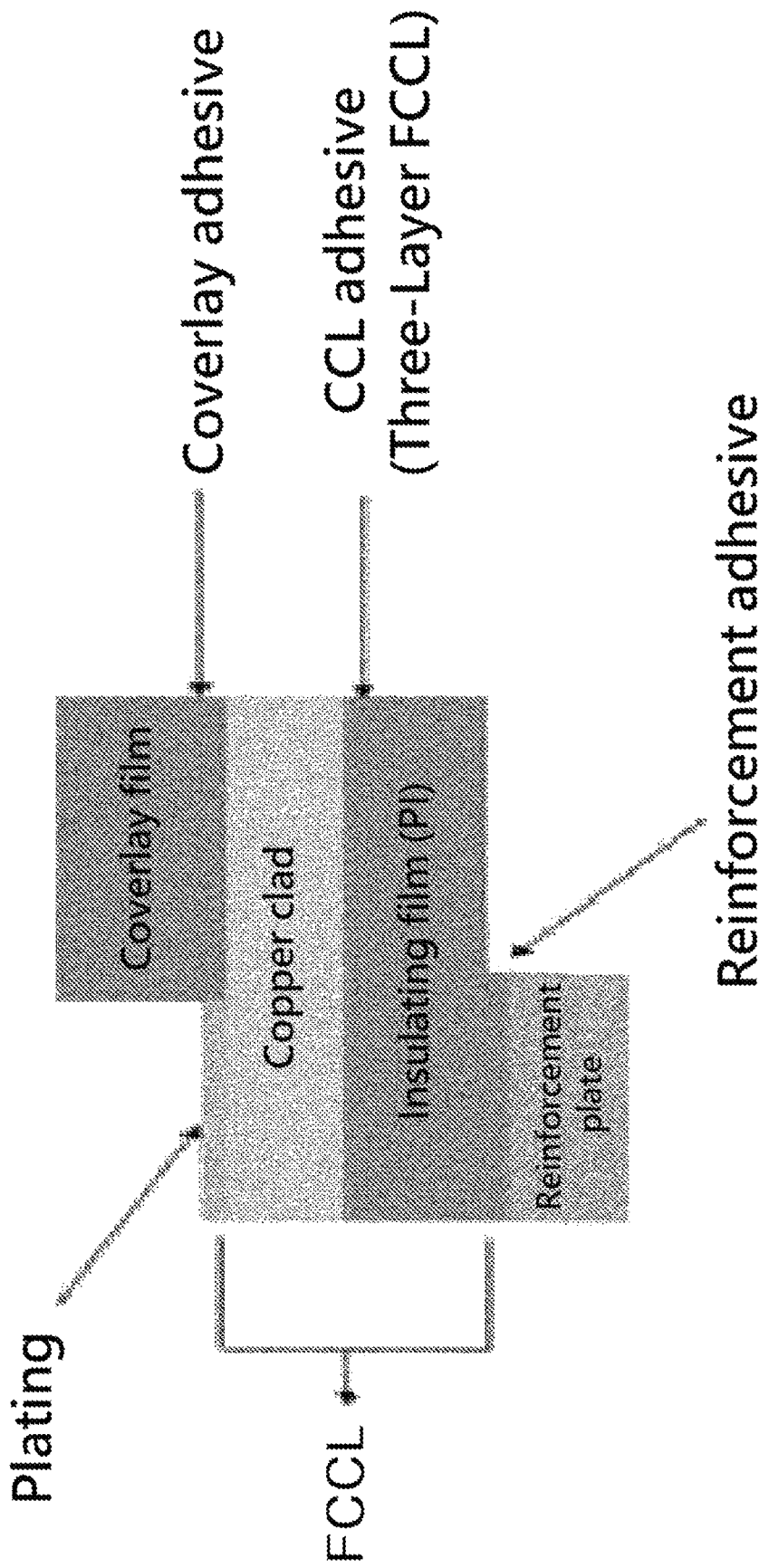
FIG. 1 illustrates the structure of a conventional single-side FCCL.
Figure 2:
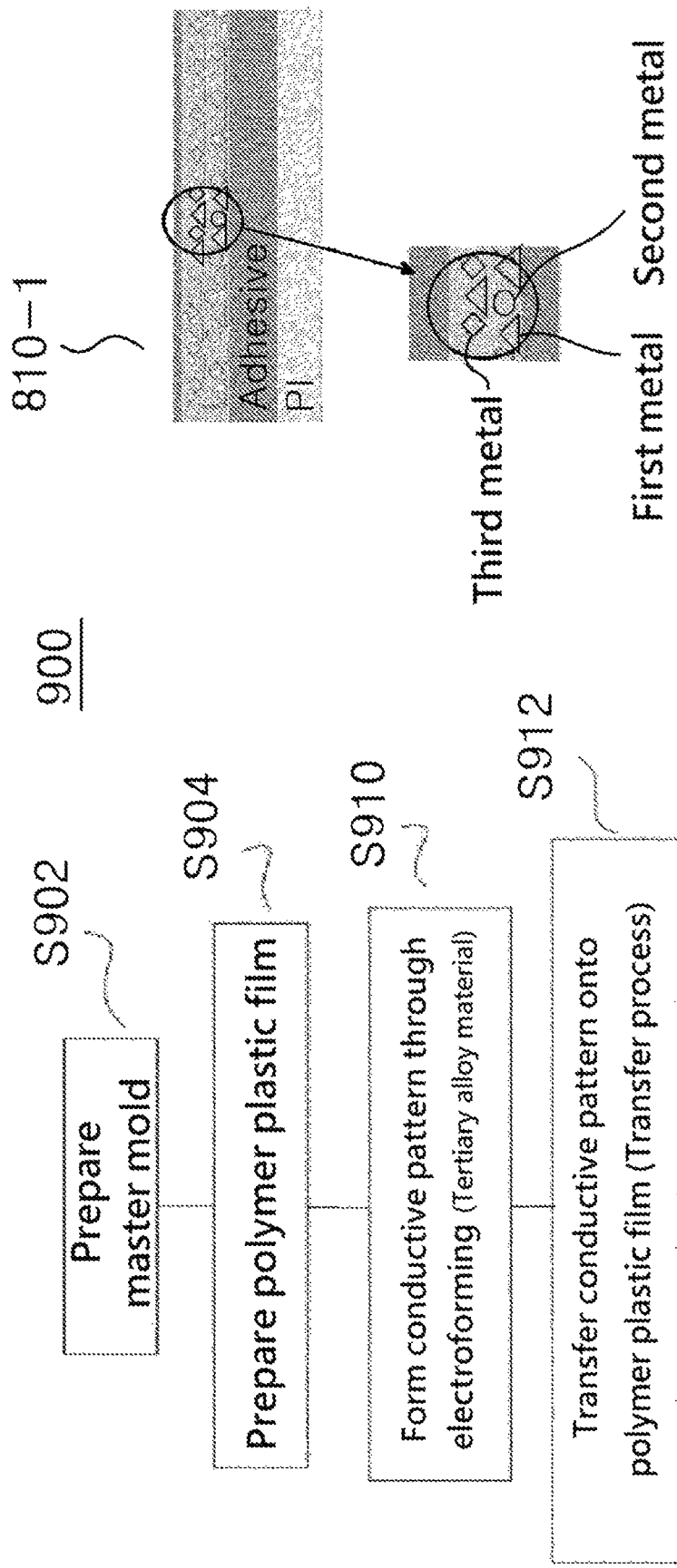
FIG. 2 is a flowchart illustrating a first embodiment of a method for manufacturing an FCCL in accordance with the present disclosure.

In FIG. 5, the same processes as those illustrated in FIG. 2 will be represented by like reference numerals, and the detailed descriptions thereof will be omitted herein.

Referring to FIG. 5, the fourth embodiment 1200 of the method for manufacturing an FCCL in accordance with the present disclosure includes an electroforming process S1202 of forming a conductive pattern on a mold for electroforming by plating the mold with a binary alloy layer, constituted by a first metal and a second metal, through electroforming.

The first metal may be copper (Cu).

The second metal is a metal for adding flexibility. The second metal may be one of tin (Sn), gold (Au), silver (Ag) and aluminum (Al). Desirably, Sn may be selected among the metals.

When Cu and Sn are used, glass potassium cyanide is used as plating liquid. In a plating bath, the metals (i.e. Cu and Sn) may be connected to an anode, and the mold for electroforming may be connected to a cathode.

After the electroforming process in step S1202, an electroplating process S1204 is performed to form a conductive pattern with a multilayered (two-layer) alloy structure constituted by the binary alloy layer and a metal layer made of a third metal by plating the binary alloy layer (the first metal+the second metal) with the metal layer made of the third metal, through electroplating.

The third metal is a metal for adding stiffness. The third metal may be one of nickel (Ni), cobalt (Co), chrome (Cr), iron (Fe), tungsten (W) and titanium (Ti). Desirably, Ni may be selected among the metals.

When Ni is used, nickel sulfate (NiSO4.6H2O), nickel chloride (NiCl2.6H2O) or boric acid (H3BO3) may be used as plating liquid. In a plating bath, the metal (i.e. Ni) may be connected to an anode, and the binary alloy layer may be connected to a cathode.

The electroforming process S1202, a transfer process S912 and the electroplating process S1204 are sequentially performed to acquire a conducive pattern with a two-layer structure in which the binary alloy layer (the first metal+the second metal) and the metal layer made of the third metal are stacked to constitute a layer structure. The conductive pattern with a two-layer structure also has the characteristic that the characteristics of the first to third metals are mixed, like a conductive pattern with a tertiary alloy structure.

Therefore, the composition ratio of the binary alloy layer (i.e. the composition ratio of the first and second metals), the thickness of the binary alloy layer, and the thickness of the metal layer made of the third metal may be controlled to manufacture a suspension that satisfies mechanical characteristics required by a micro speaker.

EMBODIMENTS FOR CARRYING OUT THE PRESENT DISCLOSURE

The terms used in this specification are only used to describe specific embodiments, and do not intend to limit the present disclosure. As used in the specification, the expressions in a singular form may include the expressions in a plural form unless referred to the contrary in the context.

Hereafter, the configuration and operation of the method for manufacturing an FCCL in accordance with the present disclosure will be described in detail with reference to the accompanying drawings.

FIG. 2 is a flowchart illustrating a first embodiment of a method for manufacturing an FCCL in accordance with the present disclosure.

A first embodiment 900 of the method for manufacturing an FCCL in accordance with the present disclosure includes manufacturing an FCCL by forming a conductive pattern 810 through electroforming, and transferring the conductive pattern onto a polymer plastic film.

The conductive pattern 810 may be made of a tertiary alloy material in which a first metal, a second metal for adding flexibility to the first metal, and a third metal for adding stiffness to the first metal are chemically alloyed (810-1).

The tertiary alloy refers to an alloy in which the molecules of different types of metals are mixed, and may be obtained through a plating process using an electroforming bath equipped with three kinds of different metals at an anode thereof.

First, a mold for electroforming the conductive pattern 810 is prepared in step S902.

The mold for electroforming has an engraved pattern formed on the surface thereof, the engraved pattern corresponding to the conductive pattern.

Specifically, a plurality of engraved patterns may be formed on the surface of the mold for electroforming, in order to form a plurality of conductive patterns 810 at a time.

A polymer plastic film is prepared in step S904.

The polymer plastic film may be a PI (Polyimide) film.

PI is used to reinforce durability and to maintain proper elasticity.

This polymer plastic film is prepared to suit the size of the mold for electroforming.

Through electroforming, the conductive pattern 810 is formed on the mold for electroforming so as to have a predetermined thickness (electroforming process in step S910).

The electroforming process is performed to form a conductive pattern made of a tertiary alloy material.

When a conductive pattern made of a tertiary alloy material is formed through electroforming, the composition of the metallic components of the alloy material may be adjusted through the composition of electrolytes corresponding to the first metal, the second metal for adding flexibility, and the third metal for adding stiffness. As a result, it is possible to control the mechanical characteristics of the conductive pattern, such as the flexibility and stiffness.

The first metal may Cu, and the second metal may be one of Sn, Au, Ag and Al. Desirably, Sn may be selected among the metals.

The third metal may be one of Ni, Co, Cr, Fe, W and Ti. Desirably, Ni may be selected among the metals.

In a plating bath, metals (i.e. Cu, Sn and Ni) may be connected to an anode, and the mold for electroforming may be connected to a cathode.

When electroplating is performed, a metal with which another metal is to be plated may be set to a cathode, and liquid containing the another metal may be set to plating liquid. Also, a metal with which another metal is to be plated may be set to a cathode, and the another metal may be set to an anode. In this way, when a current is passed through the anode, the plating metal is drawn as positive ions by the cathode, and adheres to the surface of the cathode. As such, the phenomenon where a metal is molten through electrolysis and adheres to an electrode is referred to as electrodeposition.

The conductive pattern 810 is transferred onto the polymer plastic film (transfer process in step S912).

With the polymer plastic film disposed on the conductive pattern 810, the polymer plastic film may be pressed by a pressing roller to transfer the conductive pattern 810, formed on the mold for electroforming, onto the polymer plastic film.

In the method for manufacturing an FCCL in accordance with the present disclosure, illustrated in FIG. 2, the composition ratio of the alloy constituting the conductive pattern may be adjusted. The composition ratio of the alloy may be adjusted through a process of putting the first to third metals into a plating bath for electroforming, and adjusting the concentrations of electrolytes corresponding to the first to third metals, respectively, adjusting the current density, or adjusting the conduction time.

At this time, the first to third metals may be connected to the anode, and the mold for electroforming may be connected to the cathode.

Figure 3:
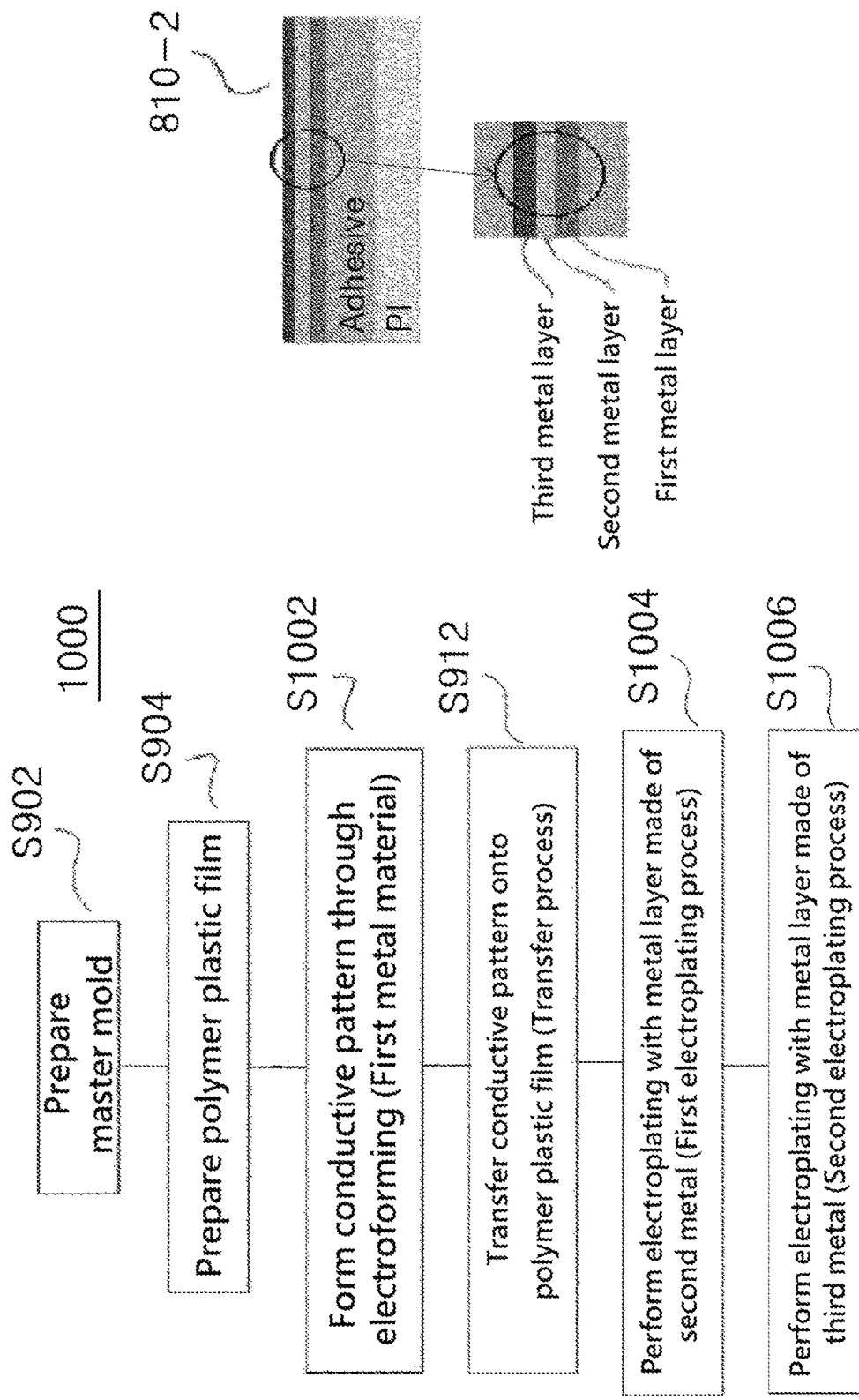
FIG. 3 is a flowchart illustrating a second embodiment of the method for manufacturing an FCCL in accordance with the present disclosure.

FIG. 3 is a flowchart illustrating a second embodiment of the method for manufacturing an FCCL in accordance with the present disclosure.

Referring to FIG. 3, the second embodiment of the method for manufacturing an FCCL in accordance with the present disclosure includes forming a multilayered (three-layer) conductive pattern, constituted by three metal layers, through sequential plating processes (see 810-2).

In FIG. 3, the same processes as those illustrated in FIG. 2 will be represented by like reference numerals, and the detailed descriptions thereof will be omitted herein. Referring to FIG. 3, a second embodiment 1000 of the method for manufacturing an FCCL in accordance with the present disclosure includes an electroforming process S1002 of forming a conductive pattern on a mold for electroforming by plating the mold with a metal layer, made of a first metal, through electroforming.

The first metal may be copper (Cu).

After the electroforming process S1002, the conductive pattern is transferred onto a polymer plastic film (transfer process S912).

After the electroforming process S1002, a conductive pattern with a multilayered (two-layer) alloy structure is formed by plating the metal layer made of the first metal with a metal layer made of a second metal, through electroplating (first electroplating process S1004), the multilayered alloy structure being constituted by the metal layer made of the first metal and the metal layer made of the second metal.

The second metal is a metal for adding flexibility.

The second metal may be one of Sn, Au, Ag and Al. Desirably, Sn may be selected among the metals.

After the first electroplating process S1002, a conductive pattern with a multilayered (three-layer) alloy structure is formed by plating the metal layer made of the second metal with a metal layer made of a third metal, through electroplating (second electroplating process S1006), the multilayered alloy structure being constituted by the metal layer made of the first metal, the metal layer made of the second metal, and the metal layer made of the third metal.

The third metal is a metal for adding stiffness.

The third metal may be one of Ni, Co, Cr, Fe, W and Ti. Desirably, Ni may be selected among the metals.

The electroforming process S1002, the transfer process S912, the first electroforming process S1004 and the second electroforming process S1006 may be sequentially performed to acquire the conductive pattern with a three-layer alloy structure in which the first to third metals are stacked. Such a conductive pattern with the three-layer alloy structure also has the characteristic that the characteristics of the first to third metals are mixed, like the conductive pattern with a tertiary alloy structure.

Figure 4:
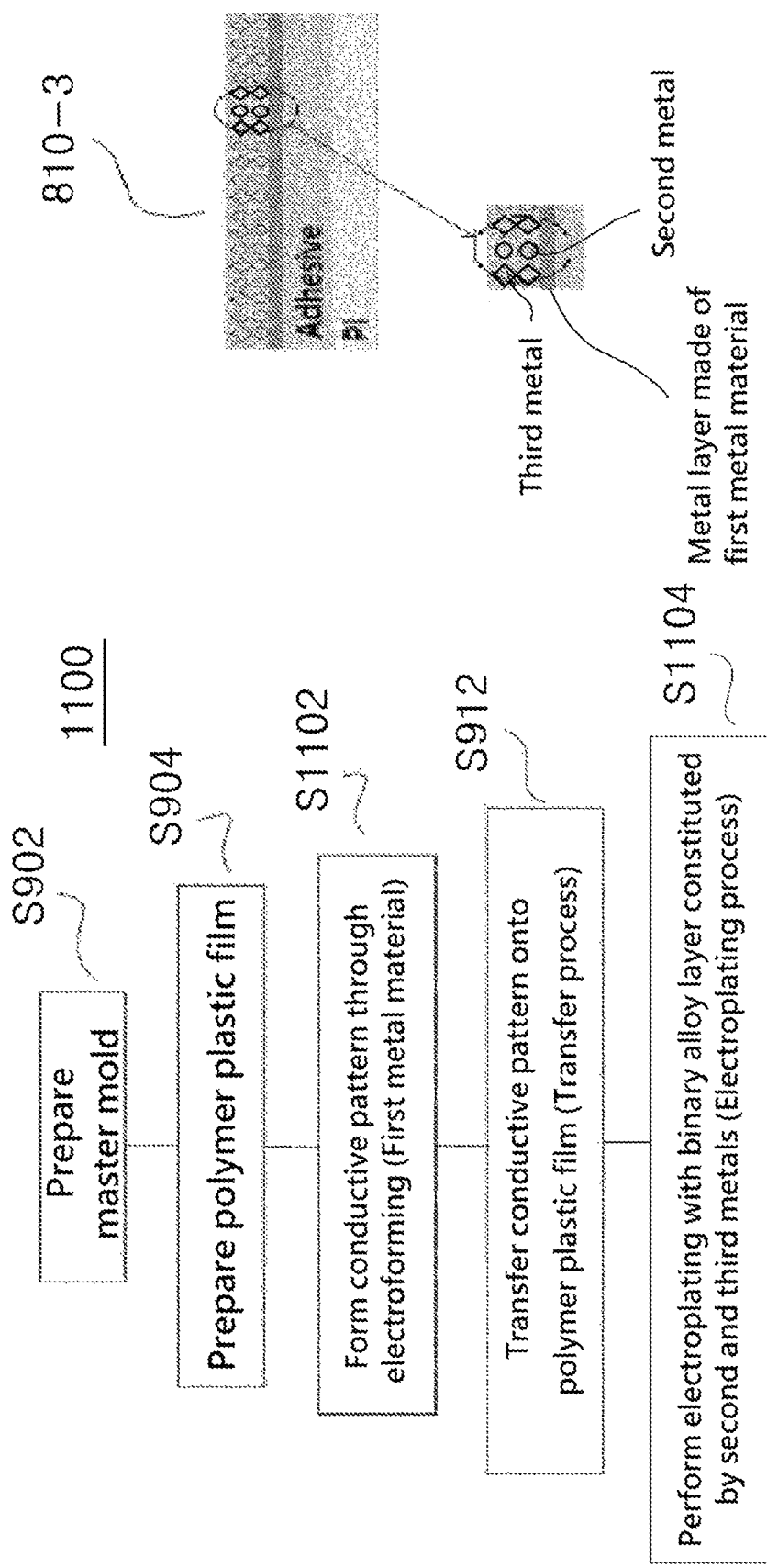
FIG. 4 is a flowchart illustrating a third embodiment of the method for manufacturing an FCCL in accordance with the present disclosure.

FIG. 4 is a flowchart illustrating a third embodiment of the method for manufacturing an FCCL in accordance with the present disclosure.

Referring to FIG. 4, the third embodiment of the method for manufacturing an FCCL in accordance with the present disclosure includes forming a conductive pattern with a multilayered (two-layer) alloy structure constituted by a metal layer and a binary alloy layer (see 810-3).

In FIG. 4, the same processes as those illustrated in FIG. 2 will be represented by like reference numerals, and the detailed descriptions thereof will be omitted herein.

Referring to FIG. 4, a third embodiment 1100 of the method for manufacturing an FCCL in accordance with the present disclosure includes an electroforming process S1102 of forming a conductive pattern on a mold for electroforming by plating the mold with a metal layer, made of a first metal, through electroforming.

The first metal may be Cu.

After the electroforming process S1102, a conductive pattern is transferred onto a polymer plastic film (transfer process S912).

Then, a conductive pattern with a multilayered (two-layer) alloy structure is formed by plating the metal layer made of the first metal with a binary alloy layer constituted by second and third metals, through electroplating (electroplating process in step S1104), the multilayered alloy structure being constituted by the metal layer made of the first metal and the binary alloy layer. The second metal is a metal for adding flexibility.

The second metal may be one of Sn, Au, Ag and Al. Desirably, Sn may be selected among the metals.

The third metal is a metal for adding stiffness. The third metal may be one of Ni, Co, Cr, Fe, W and Ti. Desirably, Ni may be selected among the metals.

The electroforming process S1102, the transfer process S912 and the electroplating process S1104 are sequentially performed to acquire a conducive pattern with a two-layer structure in which the metal layer made of the first metal and the binary alloy layer (the second metal+the third metal) are stacked to constitute a layer structure. The conductive pattern with a two-layer alloy structure also has the characteristic that the characteristics of the first to third metals are mixed, like a conductive pattern with a tertiary alloy structure.

Therefore, the thickness of the metal layer made of the first metal, the composition ratio of the binary alloy layer (the composition ratio of the second and third metals), and the thickness of the binary alloy layer may be adjusted to manufacture a suspension that satisfies mechanical characteristics required by a micro speaker.

FIGS. 6A to 6D illustrate the layer structures of FCCLs in accordance with the present disclosure.

Figure 6:
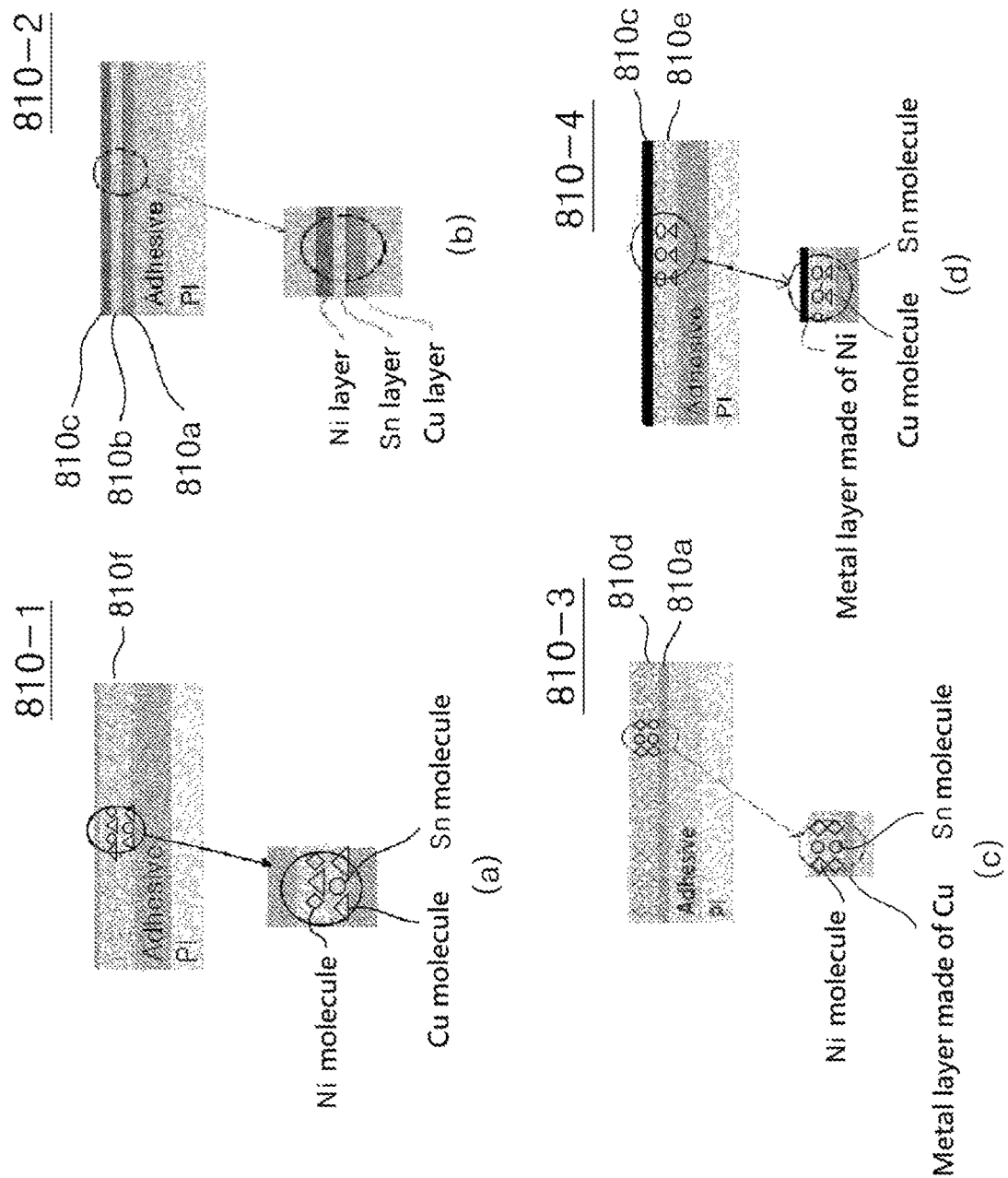
FIGS. 6A to 6D illustrate the layer structures of FCCLs manufactured by the method for manufacturing an FCCL in accordance with the present disclosure.

FIG. 6A illustrates an FCCL having a conductive pattern made of a tertiary alloy material.

FIG. 6B illustrates an FCCL having a conductive pattern with a three-layer alloy structure.

FIGS. 6C and 6D illustrate FCCLs each having a conductive pattern with a two-layer alloy structure.

An FCCL 810-1 having a conductive pattern made of a tertiary alloy made is an FCCL manufactured by the method illustrated in FIG. 2.

An FCCL 810-2 having a conductive pattern with a three-layer alloy structure is an FCCL manufactured by the method illustrated in FIG. 3.

FCCLs 810-3 and 810-4 each having a conductive pattern with a two-layer alloy structure may be FCCLs manufactured by the methods illustrated in FIGS. 4 and 5, respectively.

Referring to FIG. 6A, the conductive pattern 810-1 made of a tertiary alloy material may have a tertiary alloy layer 810*f* in which molecules of Cu, Sn and Ni are mixed.

Here, Sn is a metal for adding flexibility to Cu, and Ni is a metal for adding stiffness to Cu.

That is, the composition ratio of Cu, Sn and Ni may be adjusted to form the conductive pattern 810-1 having desired flexibility and stiffness.

Referring to FIG. 6B, the conductive pattern 810-2 having a three-layer alloy structure includes a copper layer 810*a*, a tin layer 810*b* and a nickel layer 810*c*, which are sequentially stacked.

That is, the thicknesses of the copper layer 810*a*, the tin layer 810*b* and the nickel layer 810*c* may be adjusted to acquire the conductive pattern 810-2 whose flexibility and stiffness are changed.

The thicknesses of the copper layer 810*a*, the tin layer 810*b* and the nickel layer 810*c* may be controlled by adjusting the concentrations of electrolytes corresponding to the respective metals, the current density and the conduction time during a process of sequentially passing the conductive pattern through an electroforming bath equipped with copper, a plating bath equipped with tin, and a plating bath equipped with nickel.

Referring to FIG. 6C, the conductive pattern 810-3 having a two-layer alloy structure includes a metal layer 810a made of copper and a binary alloy layer 810d made of tin and nickel, which are sequentially stacked.

That is, the thickness of the metal layer 810a made of copper and the composition ratio and thickness of the binary alloy layer 810d made of tin and nickel may be adjusted to acquire the conductive pattern 810-3 whose flexibility and stiffness are changed.

The thicknesses of the metal layer 810a made of copper and the binary alloy layer 810d made of tin and nickel may be controlled by adjusting the concentrations of electrolytes corresponding to the respective metals, the composition ratio of the electrolytes, the current density, and the conduction time, during a process of sequentially passing the conductive pattern through an electroforming bath equipped with copper and an electroplating bath equipped with tin and nickel.

Referring to FIG. 6D, the conductive pattern 810-4 having a two-layer alloy structure includes a binary alloy layer 810e made of copper and tin and a metal layer 810c made of nickel, which are sequentially stacked.

That is, the composition ratio and thicknesses of the binary alloy layer 810e made of copper and tin and the thickness of the metal layer 810c made of nickel may be adjusted to acquire the conductive pattern 810-4 whose flexibility and stiffness are changed.

The thicknesses of the binary alloy layer 810e made of copper and tin and the metal layer 810c made of nickel may be controlled by adjusting the concentrations of electrolytes corresponding to the respective metals, the composition ratio of the electrolytes, the current density, and the conduction time, during a process of sequentially passing the conductive pattern through an electroforming bath equipped with copper and tin and an electroplating bath equipped with nickel.

As described above, the present disclosure has been described through specific matters such as concrete constituent elements, the limited embodiments and accompanying drawings, but such descriptions are only provided to promote overall understandings of the present disclosure, and the present disclosure are not limited thereto. The present disclosure may be variously changed and modified from the descriptions by those skilled in the art to which the present disclosure pertains. Therefore, the spirit of the present disclosure is neither limited to nor defined by the above-described embodiments, and the claims to be described and equivalents or equivalent modifications of the claims may belong to the scope of the spirit of the present disclosure.

INDUSTRIAL APPLICABILITY

A core part of an electronic product is a PCB. Today, the FPCB market is most considerably changed among the PCB markets. FPCB refers to a wiring board using a flexible insulating board.

FCCL is the core material of the FPCB.

The present disclosure relates to a method for manufacturing an FCCL capable of controlling the flexibility and stiffness of an FPCB conductive pattern. The present disclosure is industrially applicable because the present disclosure can provide a method for manufacturing a conductive pattern, which is capable of controlling the flexibility and stiffness of a conductive pattern.

The invention claimed is:

1. A method for manufacturing an FCCL (Flexible Copper Clad Laminate), the method comprising:
    forming a conductive pattern on a mold for electroforming through electroforming; and
    transferring the conductive pattern from the mold for electroforming to the bottom of a polymer plastic film,
    wherein the forming of the conductive pattern is performed in a single bath with a plating liquid from which a first metal, a second metal and a third metal are plated,
    wherein the first metal is copper (Cu), the second metal serves to add flexibility and is one of tin (Sn), gold (Au), silver (Ag) and aluminum (Al), and the third metal serves to add stiffness and is one of nickel (Ni), cobalt (Co), chrome (Cr), iron (Fe), tungsten (W) and titanium (Ti),
    wherein the FCCL is capable of controlling the flexibility and stiffness of the conductive pattern, and
    wherein a composition of an alloy material including the first metal, the second metal and the third metal is controlled by a composition of electrolytes corresponding to the second metal for adding flexibility, and the third metal for adding stiffness, thereby controlling the flexibility and stiffness of the conductive pattern.

2. The method of claim 1, wherein the second metal is Sn.

3. The method of claim 2, wherein the third metal is Ni.

4. The method of claim 1, wherein the polymer plastic film is made of PI (Polyimide).

5. A method for manufacturing an FCCL (Flexible Copper Clad Laminate), the method comprising:
    forming a conductive pattern, having a first metal layer made of a first metal, on a mold for electroforming through electroforming;
    transferring the conductive pattern, having the first metal layer made of the first metal, from the mold for electroforming to the bottom of a polymer plastic film;
    forming a conductive pattern with a two-layer alloy structure constituted by the first metal layer made of the first metal and a second metal layer made of a second metal, by plating the bottom of the first metal layer made of the first metal with the second metal; and
    forming a conductive pattern with a three-layer alloy structure, constituted by the first metal layer made of the first metal, the second metal layer made of the second metal, and a third metal layer made of a third metal, by additionally plating the bottom of the second metal layer made of the second metal with the third metal layer made of the third metal, wherein the third metal serves to add stiffness, and is one of Ni, Co, Cr, Fe, W and Ti,
    wherein the first metal is Cu, and the second metal serves to add flexibility and is one of Sn, Au, Ag and Al,
    wherein the FCCL is capable of controlling the flexibility and stiffness of the conductive pattern, and
    wherein a composition of an alloy material including the first metal, the second metal and the third metal is controlled by a composition of electrolytes corresponding to the first metal, the second metal for adding flexibility, and the third metal for adding stiffness, thereby controlling the flexibility and stiffness of the conductive pattern.

6. The method of claim 5, wherein the second metal is Sn.

7. The method of claim 5, wherein the second metal is Sn, and the third metal is Ni.

8. The method of claim 5, wherein the polymer plastic film is made of PI.

9. A method for manufacturing an FCCL (Flexible Copper Clad Laminate), the method comprising:
- forming a conductive pattern, having a first metal layer made of a first metal, on a mold for electroforming through electroforming;
- transferring the conductive pattern, having the first metal layer made of the first metal, from the mold for electroforming to the bottom of a polymer plastic film; and
- forming a conductive pattern with a two-layer alloy structure, constituted by the first metal layer made of the first metal and a binary alloy layer of a second metal and a third metal, by plating the bottom of the first metal layer made of the first metal with a binary alloy made of the second metal and the third metal,
- wherein the first metal is Cu, the second metal serves to add flexibility and is one of Sn, Au, Ag and Al, and the third metal serves to add stiffness and is one of Ni, Co, Cr, Fe, W and Ti,
- wherein the FCCL is capable of controlling the flexibility and stiffness of the conductive pattern, and
- wherein a composition of an alloy material including the first metal, the second metal and the third metal is controlled by a composition of electrolytes corresponding to the first metal, the second metal for adding flexibility, and the third metal for adding stiffness, thereby controlling the flexibility and stiffness of the conductive pattern.

10. The method of claim 9, wherein the second metal is Sn.

11. The method of claim 10, wherein the third metal is Ni.

12. The method of claim 9, wherein the polymer plastic film is made of PI (Polyimide).

13. A method for manufacturing an FCCL (Flexible Copper Clad Laminate), the method comprising:
- forming a conductive pattern with a binary alloy layer on a mold for electroforming by plating the mold with a binary alloy of a first metal and a second metal through electroforming;
- transferring the conductive pattern having the binary alloy layer from the mold for electroforming to the bottom of a polymer plastic film; and
- forming a conductive pattern with a two-layer structure, constituted by the binary alloy layer and a third metal layer made of a third metal, by plating the bottom of the binary alloy layer with the third metal layer made of the third metal,
- wherein the first metal is Cu, the second metal serves to add flexibility and is one of Sn, Au, Ag and Al, and the third metal serves to add stiffness and is one of Ni, Co, Cr, Fe, W and Ti,
- wherein the FCCL is capable of controlling the flexibility and stiffness of the conductive pattern, and
- wherein a composition of an alloy material including the first metal, the second metal and the third metal is controlled by a composition of electrolytes corresponding to the first metal, the second metal for adding flexibility, and the third metal for adding stiffness, thereby controlling the flexibility and stiffness of the conductive pattern.

14. The method of claim 13, wherein the second metal is Sn.

15. The method of claim 14, wherein the third metal is Ni.

16. The method of claim 13, wherein the polymer plastic film is made of PI.

* * * * *